United States Patent
Deml et al.

(10) Patent No.: US 9,124,269 B2
(45) Date of Patent: Sep. 1, 2015

(54) OUTPUT SUBASSEMBLY AND METHOD OF OPERATING THE OUTPUT SUBASSEMBLY

(71) Applicants: Michael Deml, Bruck (DE); Martin Fichtlscherer, Kastl (DE); Sevan Haritounian, Amberg (DE); Sebastian Kemptner, Fensterbach-Dürnsricht (DE); Thomas Kiendl, Wernberg-Köblitz (DE); Mathias König, Neuhaus an der Pegnitz (DE); Reinhard Mark, Hersbruck (DE); René Vogel, Hersbruck (DE)

(72) Inventors: Michael Deml, Bruck (DE); Martin Fichtlscherer, Kastl (DE); Sevan Haritounian, Amberg (DE); Sebastian Kemptner, Fensterbach-Dürnsricht (DE); Thomas Kiendl, Wernberg-Köblitz (DE); Mathias König, Neuhaus an der Pegnitz (DE); Reinhard Mark, Hersbruck (DE); René Vogel, Hersbruck (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 13/973,678

(22) Filed: Aug. 22, 2013

(65) Prior Publication Data

US 2014/0062540 A1 Mar. 6, 2014

(30) Foreign Application Priority Data

Aug. 29, 2012 (EP) .................................... 12182167

(51) Int. Cl.
*H03K 3/00* (2006.01)
*H03K 17/16* (2006.01)
*H03K 17/12* (2006.01)

(52) U.S. Cl.
CPC ................ *H03K 17/16* (2013.01); *H03K 17/12* (2013.01)

(58) Field of Classification Search
USPC ......... 327/108–112, 427, 434, 437, 392–406, 327/541, 543, 544, 546; 326/82, 83, 26, 27, 326/87; 363/130–132; 323/272, 282
See application file for complete search history.

(56) References Cited

U.S. PATENT DOCUMENTS

| | | | |
|---|---|---|---|
| 6,310,468 B1 * | 10/2001 | Feldtkeller | 323/282 |
| 6,333,620 B1 * | 12/2001 | Schmitz et al. | 320/132 |
| 8,008,953 B1 * | 8/2011 | Brumett et al. | 327/109 |
| 2003/0038615 A1 * | 2/2003 | Elbanhawy | 323/282 |
| 2008/0012623 A1 | 1/2008 | Oster et al. | |
| 2011/0181293 A1 * | 7/2011 | Fichtlscherer et al. | 324/537 |
| 2012/0307540 A1 * | 12/2012 | Tagome | 363/131 |
| 2012/0313687 A1 * | 12/2012 | Togneri et al. | 327/404 |
| 2013/0088278 A1 * | 4/2013 | Spalding et al. | 327/401 |

FOREIGN PATENT DOCUMENTS

| | | |
|---|---|---|
| DE | 10 2006 030 448 | 1/2008 |
| WO | WO 2011096232 | 8/2011 |

* cited by examiner

*Primary Examiner* — Lincoln Donovan
*Assistant Examiner* — Thomas Skibinski
(74) *Attorney, Agent, or Firm* — Cozen O'Connor

(57) ABSTRACT

A method for operating an output subassembly in which a first driver module is operated between a power supply connection on the output subassembly, and an output and is actuated via a first control input to connect the voltage to the output, wherein a second driver module is operated in parallel with the first driver module and is actuated, via a second control input, to connect a voltage to an output, where at an initial time a control circuit receives a command to switch the voltage to the output and the control circuit thereupon initially actuates the second control input for a predefined first length of time, so that the second driver module is operated with current limitation up to a maximum current and, after a predefined second length of time, measured from the initial time, the control circuit actuates the first control input when the command is in effect.

9 Claims, 3 Drawing Sheets

OUTPUT SUBASSEMBLY AND METHOD OF OPERATING THE OUTPUT SUBASSEMBLY

BACKGROUND OF THE INVENTION

1. Field of the Invention

The invention relates to a method for operating an output subassembly having an output circuit with which a voltage is switched through to a load connected to an output, which results in a current, by which a first driver module is operated between a power supply connection on the output subassembly and the output and is actuated via a first control input for connecting the voltage through to the output.

2. Description of the Related Art

For switching, for example, capacitive loads using a digital output subassembly, preferably of a fail-safe type, in a programmable logic controller, use is generally made of electronic power subassemblies for switching the positive output voltage in an output subassembly.

In particular, when capacitive loads with a low series resistance are switched on, a high switch-on current, arises at initial moments. In the case of power subassemblies that have a switch-off facility for the short-circuit situation, this high current can lead to the activation of over-current monitoring or short-circuit monitoring, and thus to the switching off of the power subassembly.

DE 10 2006 030 448 A1 discloses an output circuit for an output subassembly used for switching at least one connected load.

Because the physical size of output subassemblies, in particular in automation technology, is becoming steadily smaller, a solution is sought for restricting the heating to permissible values, or for keeping the loss power as low as possible, with a reduced physical size of the output subassembly and additionally increased packing density of electronic components on a circuit board in the output subassembly.

SUMMARY OF THE INVENTION

It is accordingly an object of the present invention to provide an output subassembly which makes it possible, in particular when switching capacitive loads, to withstand the high switch-on current that prevails at the start of a switching operation and nevertheless to avoid the output subassembly being too greatly stressed by the resulting loss heat.

This and other objects and advantages are achieved in accordance with the invention by providing a method for operating an output subassembly having an output circuit by which a voltage is connected through to a load connected to an output, which results in a current, by which a first driver module is operated between a supply voltage connection on the output subassembly and the output and is actuated via a first control input to connect a voltage through to the output. In addition, a second driver module is operated in parallel with the first driver module between the supply voltage connection and the output, and is also actuated, via a second control input, for connecting a voltage through to the output, where a control circuit receives, at a starting time point, a switching command to switch the voltage through to the output and the control circuit thereupon actuates the second control input for a predefined first length of time, so that the second driver module is operated with current limitation up to a maximum current. After a predefined second length of time has elapsed, measured from the starting time point, the control circuit then actuates the first control input for as long as the switching command remains in effect. The output subassembly is thus operated by two types of driver modules or electronic power components, as applicable, for example, a main driver unit for switching via a switching command from a user program in a programmable logic controller and a secondary driver unit, and for switching the capacitive load but with the primary function of accommodating the high switch-on current prevailing at the start of a switching operation. For this purpose, this secondary driver unit, i.e., the second driver module, is equipped with a current limitation device, and is operated such that limitation of the current up to a maximum current is effected at least for a first length of time T1. By using the second driver module to connect the load, which is preferably a capacitive load, for an exemplary length of time of approximately a few milliseconds, making additional use of current limitation, the load is then already connected up and, in the case of a load that may be capacitive, this ensures the almost complete charging up of the capacitance. After this, the first driver module is actuated, i.e., the main driver is switched in, and the power losses that arise can be distributed between the first driver module and the second driver module.

With this method, the second length of time will preferably be chosen to be less than the first length of time, or the same as the first length of time. The current, and with it the loss power, are thereby split for a period of time between two driver modules or semiconductor switching elements, as applicable, and any heat developed in the output subassembly can be better dissipated.

In continuous operation the power loss, and the temperatures which at the same time arise from it in the switched-on state, can be kept low even when capacitive loads are switched on because the first driver module has a lower circuit resistance than the second driver module. The circuit resistance of the second driver module is greater because it is equipped with a current limitation device.

It is advantageous to use the method in output subassemblies that represent a fail-safe automation component, designed for functional security.

With regard to security, the second driver module will be operated using a wire break testing facility, and will be cyclically activated to perform testing for a wire break in the wire leading to the load, where the first driver module is switched off during this test time. The length of the test time, and hence of the switched off time, is short enough so that it has no effect on the proper functioning of the load that is being actuated.

The problem of switching on capacitive loads, as mentioned in the introduction, is accordingly solved by using one driver module as a wire break driver with current limitation, and hence with a relatively high circuit resistance, i.e., a correspondingly high loss power, and as the main driver a driver module with no current limitation, which has a relatively low circuit resistance.

The object of the invention is also achieved by an output subassembly incorporating an output circuit, an output, a supply voltage connection, a first driver module with a first control input, where the first driver module is configured to connect a voltage through to the output and is arranged between the supply voltage connection and the output, a second driver module, with a second control input, is arranged in parallel with the first driver module between the supply voltage connection and the output and is also configured to connect a voltage through to the output, where a control circuit has a command input, a first command output and a second command output, and is configured to accept at a starting time point via the command input a switching command for connecting the voltage through to the output and thereupon to actuate the second control input for a predefined first length of time, and where the second driver module is provided with a current limitation device for a maximum current and the control circuit is further configured so that after a predefined second length of time has elapsed, measured from the starting time point, the control circuit actuates the first control input for as long as the switching command remains in effect.

In order to withstand a high switch-on current, in particular when switching capacitive loads, the second driver module is equipped with a current limitation device, which only permits a maximum current and hence also a maximum power loss, and thus also only evokes a maximum heating-up. This second driver module is actuated via the second control input, preferably only until the capacitance of a capacitive load is nearly charged up, and for any further charging operation the current would then fall again to below the value of a maximum permissible current.

Because the second driver module is preferably switched off again after this nearly charged-up state has been reached, and the first driver module then conducts the current for the load that is being switched, the output subassembly of the first driver module has a current switch-off device that thereafter only takes effect if, for example, a fault such as a short circuit occurs.

In particular when use is made of fail-safe output subassemblies in automation engineering, the second driver module additionally includes a wire break testing facility, which is designed for cyclic wire break testing in a wire that passes to the load.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The drawing shows an exemplary embodiment, in which.

DETAILED DESCRIPTION OF THE PREFERRED EMBODIMENTS

Figure 1:
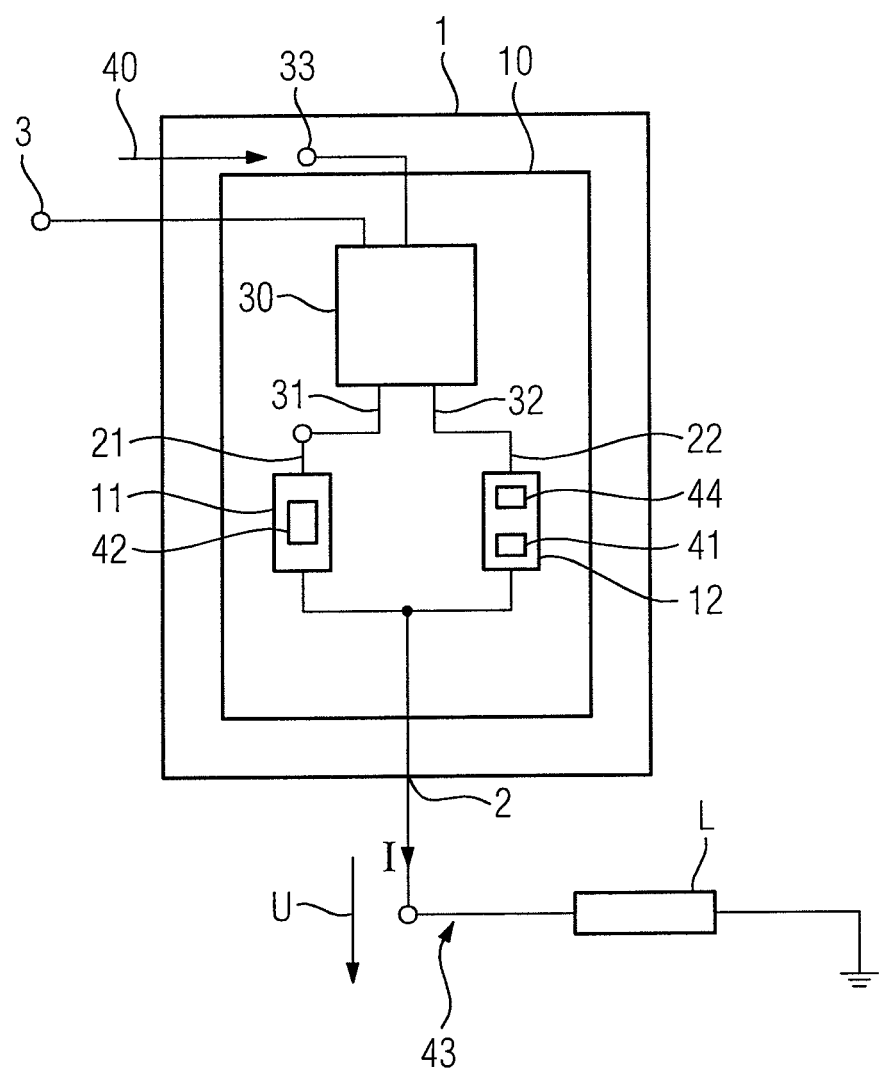
FIG. 1 is an illustration of an output subassembly with a first driver module and a second driver module.

Shown in FIG. 1 is an output subassembly 1, incorporating an output circuit 10, an output 2, a supply voltage connection 3, a first driver module 11 with a first control input 21 and a second driver module 12 with a second control input 22. The output subassembly 1 with its output circuit 10 is configured to connect a voltage U through an output 2 to a load L, which results in a current I.

In order to keep the power loss that arises in the output circuit 10 within limits, two semiconductor circuit elements, i.e., the first driver module 11 and the second driver module 12, are used such that these driver modules 11, 12 are switched sequentially one after the other. For this purpose, the method provides that, for the operation of the output subassembly, the second driver module 12 is operated in parallel with the first driver module 11, between the supply voltage connection 3 and the output 2, and that both driver modules 11, 12 are configured to provide the connection of a voltage through to the output 2. If the first driver module 11 receives a switch-on command via a first control input 21, it switches the voltage U through to the output 2, which introduces a current I into the load L. If the second driver module 12 also receives a switch-on command via a second control input 22, then the second driver module 12 also introduces a current I into the load L which is to be connected.

The output subassembly 1 is preferably used in an automation environment with a programmable logic controller (not shown). For the purpose of activating the output subassembly, the programmable logic controller sends out a switching command 40, for example, via a communication network. This switching command 40 is accepted through a command input 33 in the control circuit 30 and a switching operation for the capacitive load L is thereby started through the driver modules 11, 12.

In this case, the control circuit 30 is configured such that if the control circuit 30 receives the switching command 40 for switching the voltage U through to the output 2 at a starting time point TO, then the first action of the control circuit 30 is to actuate the second control input 22 via its second command output 32 for a predefined first length of time T1. The second driver module 22 is provided with a current limitation device 41. As a result, the current I cannot exceed a maximum permissible current I (see FIG. 3).

The control circuit 30 is, furthermore, configured such that, after a predefined second length of time T2 has elapsed, measured from the starting time point TO, the control circuit 30 then additionally actuates the first control input 21 via a first command output 31 for as long as the switching command 40 remains in effect.

In this case, the predefined times, i.e., the first length of time T1 and the second length of time T2, are implemented in the control circuit 30 such that the second length of time T2 is chosen to be less than the first length of time T1 or equal to the first length of time T1.

For operation in automation technology, i.e., when use is made of output subassemblies as fail-safe automation components designed for functional security, the second driver module has a wire break testing facility 44, which is configured such that the wire break testing facility 44 is activated cyclically for the wire break testing of a wire 43 which leads to the load L, where the first driver module 11 is briefly switched off during this test time.

Figure 2:
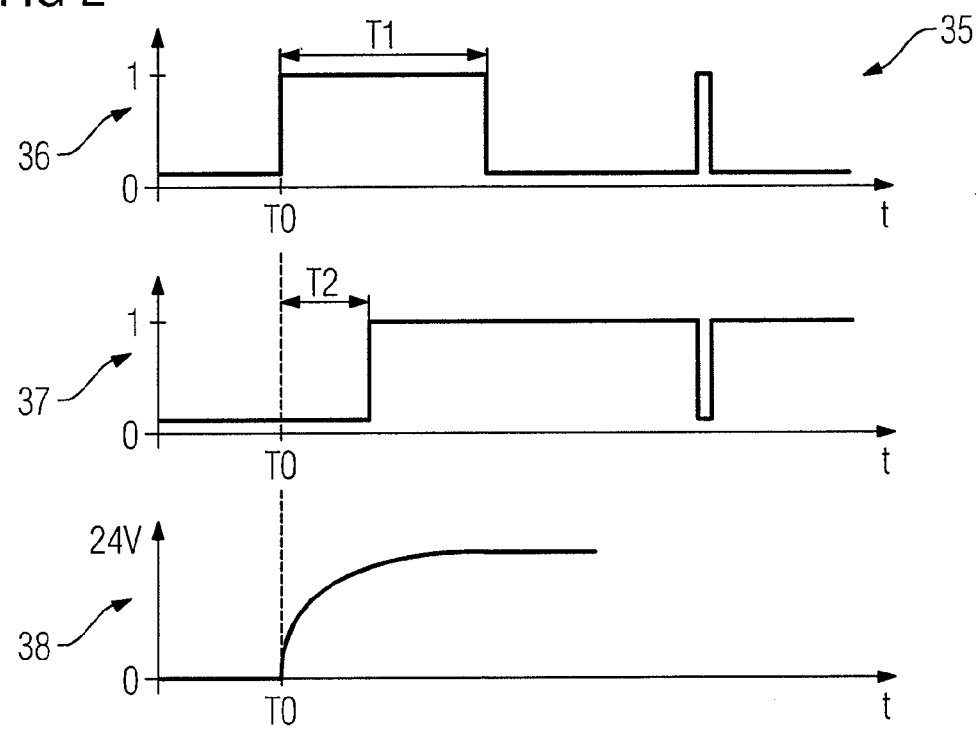
FIG. 2 shows graphical plots against time of the actuation of the driver modules, together with the output voltage at the output.

FIG. 2 shows graphs 35 against time of the actuation of the driver modules 11,12 and a graph of the voltage 38 against time for the output voltage at the output 2. A first diagram shows a graph over time of the signal 36 at the second control input 22 on the second driver module 12. A logical switching activity between "0" and "1" is shown against the time t. At a starting time point T0, the second control input 22 is actuated via the control circuit 30 by a logical "1". This actuation is effected for a first length of time T1. Shown under the trace 36 of the signal at the second control input 22 is a logical switching diagram for a signal trace 37 at the first control input 11. This shows that the first control input 21 of the first driver module 11 only receives its command to switch on from "0" to "1" with a time delay of a second length of time T2 after the starting time point T0.

As time proceeds, the cyclic wire break testing is indicated in the logical signal traces 36 and 37, where the driver module 22 is briefly activated for this purpose and correspondingly the first driver module 21 is briefly deactivated. If the wire break testing facility 44 contained in the second driver module 22 detects no current flow during this brief activation of the current, then the wire break testing facility 44 would output an alarm, which indicates that the wire 43 to the load L must be faulty. In order that the wire break testing facility 44 can make the measurement without error, the current I introduced by the first driver module 11 must of course be briefly interrupted.

A further voltage diagram in FIG. 2 shows the output voltage 38 at the output 2 from the output subassembly 1. At the starting time point T0, at which the second driver module 22 is activated, the output voltage 38 at the load L or the output 2, as applicable, increases gradually. This can be conceived of as a typical voltage curve for the charging behavior of a capacitor.

Figure 3:
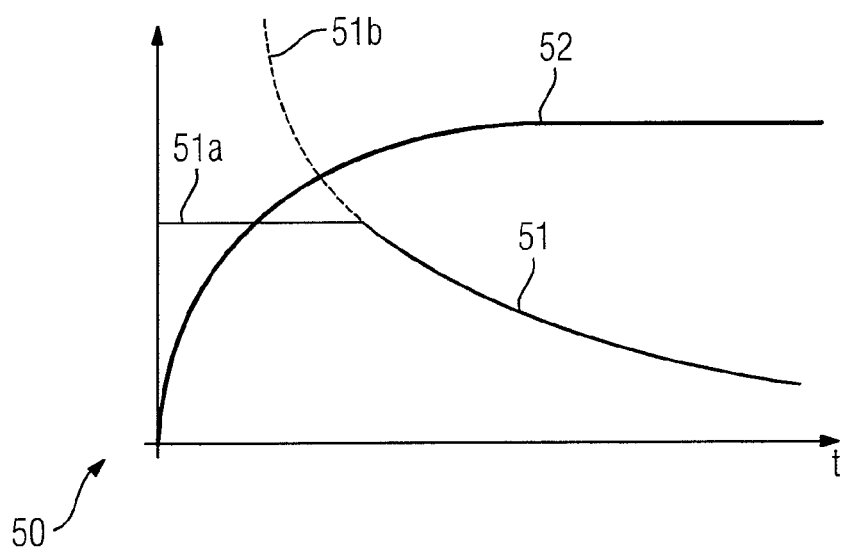
FIG. 3 is an illustration of a voltage-current diagram for the load which is to be connected.

FIG. 3 shows a voltage-current diagram 50, showing the current limitation by the current limiting device 41 in the second driver module 12. Here, one curve shows the time trace 51 of the current I where, in particular, for a short time after a switch-on time point, the graph of the current I is divided into a time trace 51a that has current limitation and a time trace 51b which has no current limitation. If a capacitive load L were switched without current limitation, the situation in the time trace 51b would arise for the current I and hence impermissibly high current values would arise in the output subassembly 1. For clarity, the time trace 51b of the current with no limitation is shown as a dashed line.

The current limitation facility 51 is implemented in the second driver module 12. As a result, when the output subassembly 1 is operated, the time trace 51a for a current with limitation would apply. The curve 52 shows the time trace of the voltage.

Figure 4:
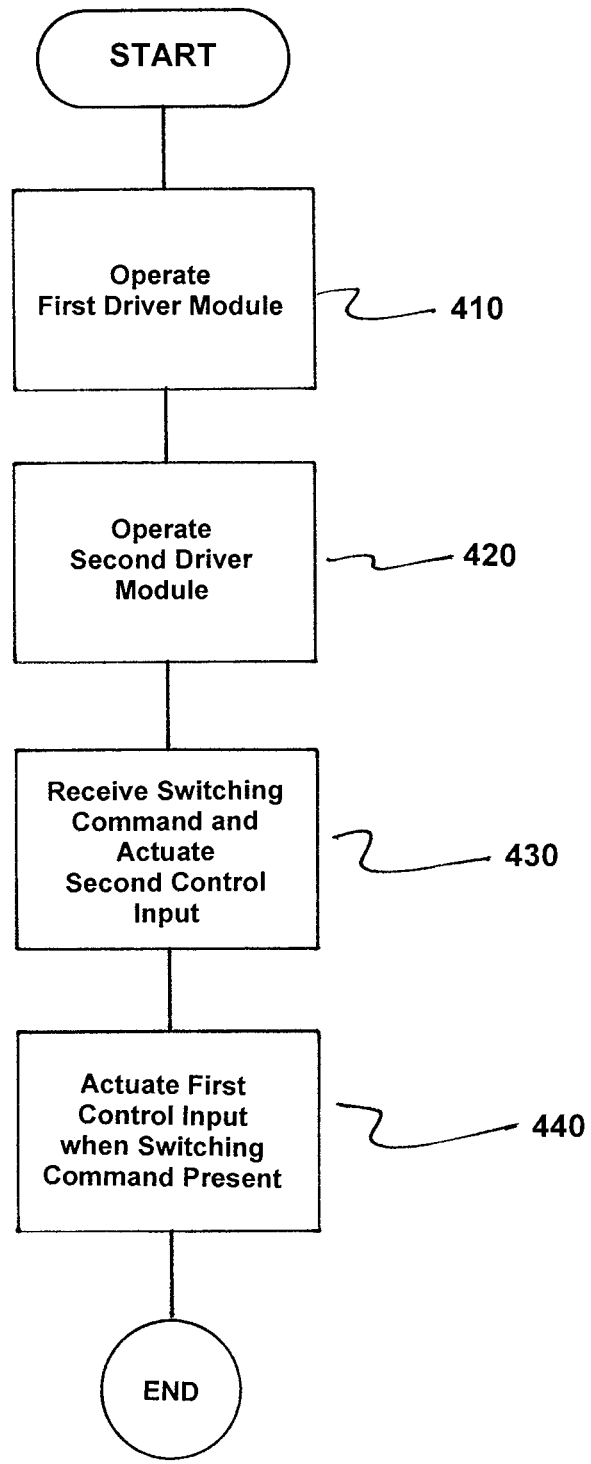
FIG. 4 is a flowchart of the method in accordance with the invention.

FIG. 4 is a flowchart of a method for operating an output subassembly having an output circuit by which a voltage is connected through to a load connected to an output, which creates a current. The method comprises operating a first driver module between a supply voltage connection on the output subassembly and the output and actuating the first driver module via a first control input to connect the voltage through to the output, as indicated in step 410.

Next, a second driver module is operated in parallel with the first driver module between the supply voltage connection and the output and actuating the second driver module, via a second control input to connect the voltage through to the output, as indicated in step 420. A switching command to switch the voltage through to the output is then received by a control circuit at a starting time point, and the second control input is now initially actuated by the control circuit for a predefined first length of time, such that the second driver module is operated with current limitation up to a maximum current, as indicated in step 430. Next, the first control input is additionally actuated by the control circuit after elapse of a predefined second length of time, which is measured from the starting time point, for as long as the switching command remains in effect, as indicated in step 440.

While there have been shown, described and pointed out fundamental novel features of the invention as applied to a preferred embodiment thereof, it will be understood that various omissions and substitutions and changes in the form and details of the methods described and the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A method for operating a fail-safe automation component to provide functional security for a programmable logic controller of an automation environment, said fail-safe automation component having an output circuit by which a voltage is connected through to a load connected to an output, which creates a current, the method comprising:

operating a first driver module between a supply voltage connection on the output subassembly and the output and actuating the first driver module via a first control input to connect the voltage through to the output, the first driver module including a current switch-off that only takes effect if a short circuit occurs;

operating a second driver module in parallel with the first driver module between the supply voltage connection and the output and actuating the second driver module, via a second control input to connect the voltage through to the output;

receiving by a control circuit, at a starting time point, a switching command from the programmable logic controller of the automation environment to switch the voltage through to the output and initially actuating, by the control circuit, the second control input for a predefined first length of time, such that the second driver module is operated with current level limitation up to a maximum current level; and actuating additionally, by the control circuit, after elapse of a predefined second length of time selected as a value which is less than or equal to a value of the first length of time, measured from the starting time point, the first control input for as long as the switching command remains in effect such that the fail-safe automation component provides functional security for the programmable logic controller of the automation environment.

2. The method as claimed in claim 1, wherein the first driver module is operated with a current switch-off device to interrupt the current when a maximum permissible current level is reached.

3. The method as claimed in claim 1, wherein the first driver module is operated with a current switch-off device to interrupt the current when a maximum permissible current level is reached.

4. The method as claimed in claim 1, wherein the connected load comprises a capacitive load.

5. The method as claimed in claim 1, further comprising:
operating the second driver module with a wire break testing facility; and
activating the second driver module cyclically to test for a wire break in a wire leading to the load;
wherein the first driver module is switched off during this test time.

6. A fail-safe automation component configured to provide functional security for a programmable logic controller of an automation environment, comprising:
an output circuit;
an output;
a supply voltage connection;
a first driver module having a first control input and a current switch-off that only takes effect if a short circuit occurs, the first driver module being configured to connect a voltage through to the output and being arranged between the supply voltage connection and the output;

a second driver module having a second control input, the second driver module being arranged in parallel with the first driver module between the supply voltage connection and the output and being configured to connect the voltage through to the output;

a control circuit having a command input, a first command output and a second command output, the control circuit being configured to accept at a starting time point, via the command input, a switching command received from the programmable logic controller of the automation environment to connect the voltage through to the output and thereupon to actuate the second control input for a predefined first length of time;

wherein the second driver module includes a current limitation device for a maximum current level and the control circuit is further configured such that after elapse of a predefined second length of time selected as a value which is less than or equal to a value of the first length of time, measured from the starting time point, the first control input is actuated for as long as the switching command remains in effect such that the fail-safe automation component provides functional security for the programmable logic controller of the automation environment.

7. The output subassembly as claimed in claim 6, wherein the first driver module includes a current switch-off device.

8. The output subassembly as claimed in claim 6, wherein the second driver module includes a wire break testing facility which is configured to cyclically test for a wire break in a wire leading to a load.

9. The output subassembly as claimed in claim 7, wherein the second driver module includes a wire break testing facility which is configured to cyclically test for a wire break in a wire leading to a load.

* * * * *